US010784001B2

(12) United States Patent
McGuire

(10) Patent No.: US 10,784,001 B2
(45) Date of Patent: Sep. 22, 2020

(54) PASSIVE MAGNETIC SHIELDING OF STRUCTURES IMMERSED IN PLASMA USING SUPERCONDUCTORS

(71) Applicant: Lockheed Martin Corporation, Bethesda, MD (US)

(72) Inventor: Thomas J. McGuire, Palmdale, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 401 days.

(21) Appl. No.: 15/873,614

(22) Filed: Jan. 17, 2018

(65) Prior Publication Data

US 2019/0221322 A1 Jul. 18, 2019

(51) Int. Cl.

| G21B 1/05 | (2006.01) |
|---|---|
| G21B 1/11 | (2006.01) |
| H01L 39/02 | (2006.01) |
| G21B 1/17 | (2006.01) |
| B64G 1/54 | (2006.01) |
| G21F 3/00 | (2006.01) |
| H05K 9/00 | (2006.01) |
| H01F 7/20 | (2006.01) |
| H01F 6/04 | (2006.01) |

(52) U.S. Cl.
CPC ............... G21B 1/11 (2013.01); B64G 1/54 (2013.01); G21B 1/05 (2013.01); G21B 1/17 (2013.01); G21F 3/00 (2013.01); H01L 39/02 (2013.01); H05K 9/0077 (2013.01); H01F 6/04 (2013.01); H01F 7/202 (2013.01)

(58) Field of Classification Search
CPC ... G21B 1/11; G21B 1/05; G21B 1/17; B64G 1/54; H05K 9/0077; G21F 3/00; H01L 39/02

USPC .................................................. 376/121, 150
See application file for complete search history.

(56) References Cited

U.S. PATENT DOCUMENTS

| 3,639,672 A | 2/1972 | Kafka |
|---|---|---|
| 4,921,661 A | 5/1990 | Leuer |

(Continued)

FOREIGN PATENT DOCUMENTS

| EP | 2981972 A2 | 2/2016 |
|---|---|---|
| FR | 2832426 | 5/2003 |

(Continued)

OTHER PUBLICATIONS

European Patent Office; Extended European Search Report re: 19150580.9; 7 pages; dated May 20, 2019.

(Continued)

*Primary Examiner* — Jack W Keith
*Assistant Examiner* — Daniel Wasil
(74) *Attorney, Agent, or Firm* — Baker Botts L.L.P.

(57) ABSTRACT

A fusion reactor includes a fusion plasma reactor chamber. A magnetic coil structure is disposed inside of the fusion plasma reactor chamber, and a structural component is also disposed inside of the fusion plasma reactor chamber. The structural component couples the magnetic coil structure to the fusion plasma reactor chamber. A superconducting material is disposed at least partially within the structural component. A plurality of cooling channels are disposed at least partially within the structural component. An insulating material is disposed at least partially within the structural component.

9 Claims, 3 Drawing Sheets

(56) References Cited

U.S. PATENT DOCUMENTS

| | | | |
|---|---|---|---|
| 5,012,860 | A | 5/1991 | Mukherjee |
| 5,023,043 | A | 6/1991 | Kotzlowski et al. |
| 5,448,214 | A | 9/1995 | Laskaris |
| 5,488,339 | A | 1/1996 | Havens et al. |
| 8,249,210 | B2 | 8/2012 | Schedler et al. |
| 8,809,824 | B1 | 8/2014 | Kinstler |
| 2014/0301517 | A1 | 10/2014 | McGuire |
| 2016/0232988 | A1* | 8/2016 | Sykes .................. G21B 1/05 |
| 2018/0068747 | A1* | 3/2018 | McGuire .............. G21B 1/05 |

FOREIGN PATENT DOCUMENTS

| | | |
|---|---|---|
| JP | 57091486 | 6/1982 |
| JP | 60187885 | 9/1985 |
| JP | 01094602 | 4/1989 |
| JP | 01119791 | 5/1989 |
| JP | 03039690 | 2/1991 |
| JP | 09054179 | 2/1997 |
| JP | 2003031049 | 1/2003 |
| WO | 2016009176 | 7/2015 |

OTHER PUBLICATIONS

Communication pursuant to Article 94(3) EPC; re: Appl. No. 19 150 580.9-1212; Reference JL98341.EPP; 5 pages, dated Mar. 13, 2020.

* cited by examiner

PASSIVE MAGNETIC SHIELDING OF STRUCTURES IMMERSED IN PLASMA USING SUPERCONDUCTORS

TECHNICAL FIELD OF THE INVENTION

This invention relates generally to superconducting materials in plasmas.

BACKGROUND

Superconductors are materials that conduct electrical current without any resistance. A unique property of superconductors is known as the Meissner effect, which is the property of superconductors to exclude magnetic fields from themselves. Most materials only display superconducting properties when cooled below a certain temperature, which may be referred to as the superconducting transition temperature or critical temperature. This temperature can vary between different superconducting materials, but is generally well below the freezing point of water.

Plasmas are ionized gases. Because plasmas are ionized, and therefor electrically charged, plasmas can be manipulated using electric and magnetic fields. Plasmas are often hotter than room temperature, with some having temperatures of millions of degrees Kelvin. Because of their high temperature, it is often desirable to keep plasmas from coming into contact with objects immersed in a plasma or with the walls of a chamber used to contain a plasma.

SUMMARY

A fusion reactor includes a fusion plasma reactor chamber. A magnetic coil structure is disposed inside of the fusion plasma reactor chamber, and a structured component is also disposed inside of the fusion plasma reactor chamber. The structural component couples the magnetic coil structure to the fusion plasma reactor chamber. A super conducting material is disposed at least partially within the structural component. A plurality of cooling channels are disposed at least partially within the structural component. An insulating material is disposed at least partially within the structural component.

A structural component in a plasma flow includes an interior structural component and a superconducting material disposed at least partially within the structural component and surrounding or adjacent to the interior structural component. A plurality of cooling channels are disposed at least partially within the structural component. An insulating material is disposed at least partially within the structural component.

A method for protecting an object immersed in a plasma includes steps of applying a magnetic field through around a superconducting material, cooling a superconducting material that surrounds the object to a temperature sufficient to cause the superconducting material to exclude the magnetic field.

Technical advantages of certain embodiments may include, protecting structural components from hot plasma without the need for an external power supply. Additionally, certain embodiments may prevent heat loss from a plasma by preventing it from contacting surfaces which could conduct heat away from the plasma. Some embodiments may also provide more complete protection of a structural component from a plasma when compared to actively powered, such as using electromagnets to generate magnetic fields, methods of protecting the structure. Further, some embodiments may offer reduced complexity when compared to actively powered methods of shielding the structure from a plasma.

BRIEF DESCRIPTION OF THE DRAWINGS

To provide a more complete understanding of the present invention and the features and advantages thereof, reference is made to the following description taken in conjunction with the accompanying drawings, in which.

DETAILED DESCRIPTION OF THE DRAWINGS

Embodiments of the present invention and its advantages are best understood by referring to FIGS. 1 through 7 of the drawings, like numerals being used for like and corresponding parts of the various drawings.

Figure 1:
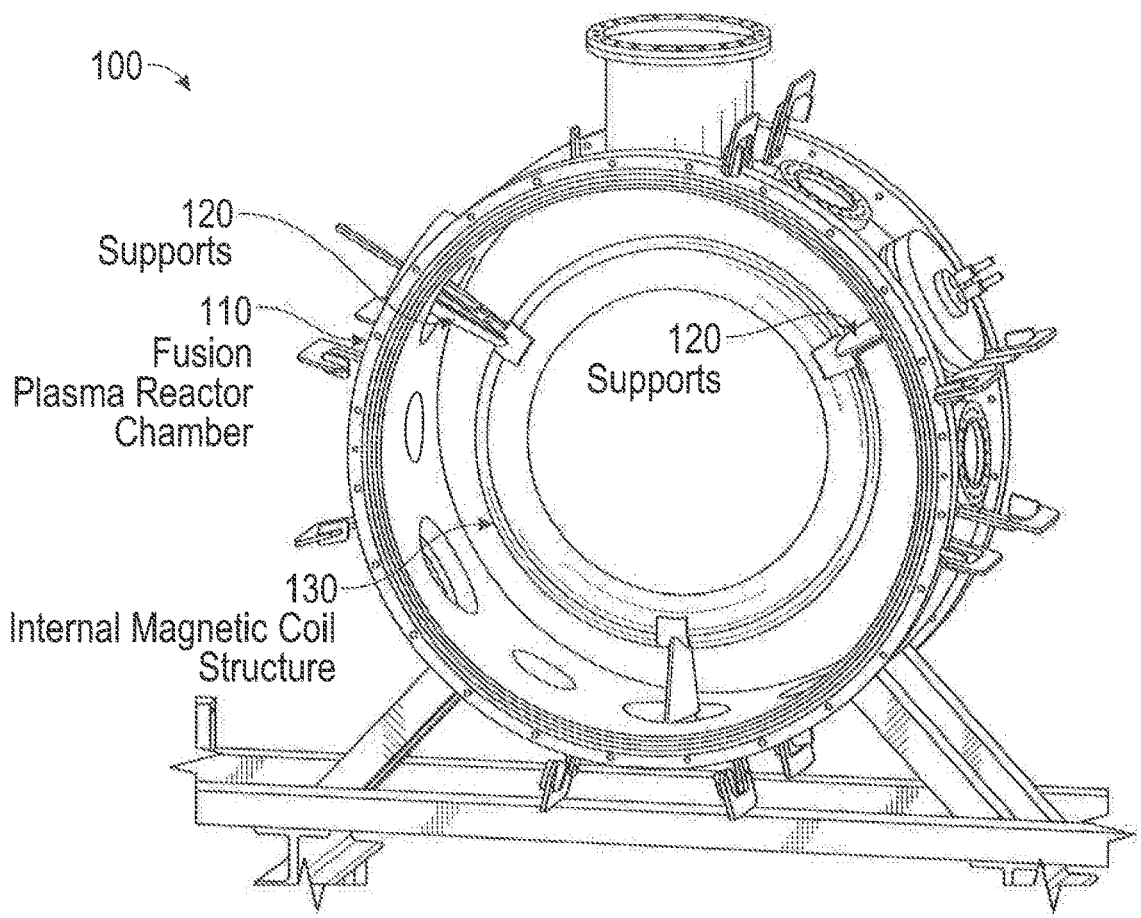
FIG. 1 illustrates a portion or a fusion reactor, according to certain embodiments.

FIG. 1 illustrates a portion of a fusion reactor 100, according to certain embodiments. Fusion reactor portion 100 includes a fusion plasma reactor chamber 110, an internal magnetic coil structure 130, and support structures 120. Support structures 120 may provide structural support for internal magnetic coil structure 130, which may be suspended in fusion plasma reactor chamber 110.

Fusion plasma reactor chamber 110 may contain a fusion plasma and provide an enclosed space for a fusion reaction to take place. Fusion plasma reactor chamber 110 may function as a structural mounting point for support structures 120, which may anchor internal magnetic coil structure 130 to fusion plasma reactor chamber 110. Fusion plasma reactor chamber 110 may also hold any number of instruments or sensors needed to initiate, maintain, monitor, control, or stop a fusion plasma reaction.

Internal magnetic coil structure 130 may generate a magnetic field that confines and directs a plasma contained within fusion plasma reactor chamber 110. A fusion reactor 100 may contain any number of internal magnetic coil structures 130. In some embodiments, the magnetic field produced by internal magnetic coil structure 130 may keep a hot plasma away from the walls of fusion plasma reactor chamber 110, which may prevent the plasma from damaging fusion plasma reactor chamber 110 or any instruments or sensors attached thereto. A magnetic field produced by internal magnetic coil structure 130 may also compress a plasma contained in fusion plasma reactor chamber 110. Compressing a plasma may aid fusion by increasing the chance that hot plasma ions contact each other and undergo fusion.

Support structures 120 may provide structural support for internal magnetic coil structure 130 inside of fusion plasma reactor chamber 110. In some embodiments, support structures 120 may anchor internal magnetic coil structure 130 to the walls of fusion plasma reactor chamber 110. Support structures 120 may also provide a path to supply power, cooling, and diagnostic leads to internal magnetic coil structure 130. Magnetic fields produced by internal magnetic coil structure 130 may not protect support structures 130 from contact with a plasma contained with in fusion plasma reactor chamber 110. In some embodiments, without a means of protection, magnetic fields produced by internal magnetic coil structure 130 may penetrate support structures 120, resulting in contact between a plasma following the magnetic field produced by internal magnetic coil structure 130 and support structures 120. Contact between a plasma and support structures 120 may damage the support structures and ultimately lead to their failure due to the high temperature and energy of the plasma. Likewise, contact between a hot plasma and support structures 120 may transfer heat out of the plasma and into support structures 120, thereby decreasing the temperature of the plasma and reducing the efficiency of any fusion reaction taking place in the plasma. Accordingly, it is desirable to prevent contact between a plasma contained in fusion plasma reactor chamber 110 and support structures 120 to prevent damage to the support structures and to maintain the temperature of the plasma.

Figure 2:
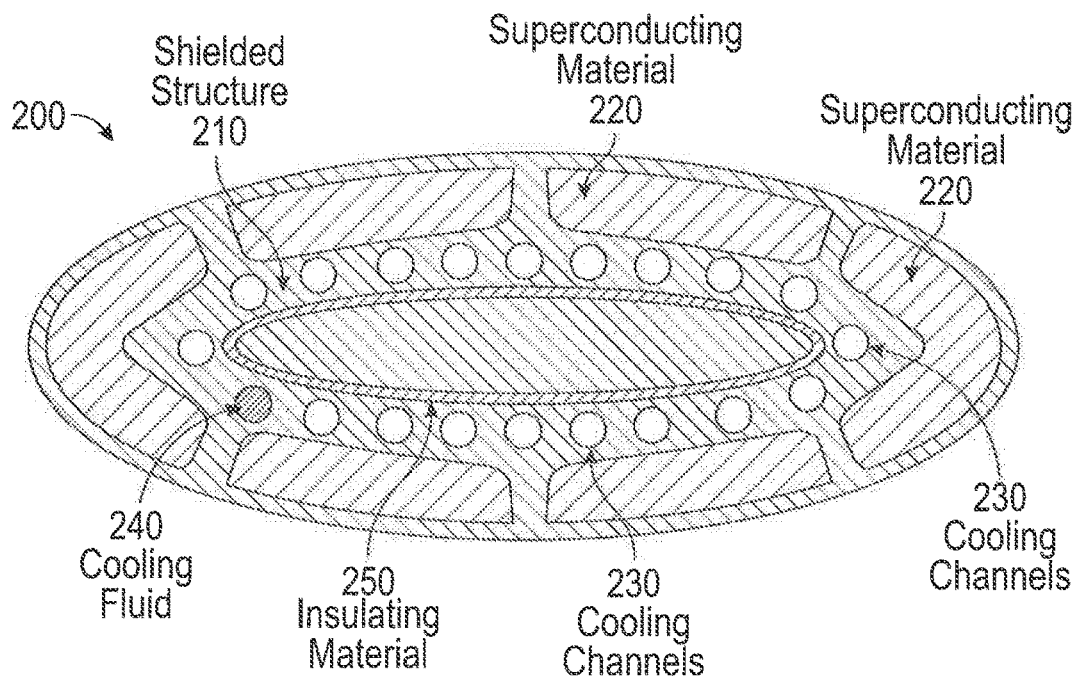
FIG. 2 illustrates a structure shielded with a superconducting material, according to certain embodiments.

FIG. 2 snows a cross section 200 of a passively shielded support structure 120 viewed from an angle viewed along the radial direction as defined relative to the axis of symmetry in FIG. 1, in other words, a cross-section viewed "top-down" into shielded support structure 120. Support structure 120 includes a shielded structure 210, superconducting material 220, cooling channels 230, cooling fluid 240, and insulating material 250.

Shielded structure 210 may include structural supports, such as beams or pipes used to anchor internal magnetic coil structure 130 to the walls of fusion plasma reactor chamber 110. Shielded structure 210 may also include routing for power and instrumentation cables for internal magnetic coil structure 130. In some embodiments, shielded structure 210 may include pipes, channels or tubes for cooling internal magnetic coil structure 130 illustrated in FIG. 1. In some embodiments, shielded structure 210 may have portions that extend beyond superconducting material 220, such that superconducting material 220 is disposed within the envelope of support structure 120. For example, a thin section of shielded structure 210 form the exterior of support structure 120, such that superconducting material 220 is disposed interior to the thin portion of shielded structure 210. In another embodiment, a protective layer of material may be disposed onto superconducting material 220 to protect superconducting material from incidental contact with a plasma.

Superconducting material 220 may be any superconducting material that is disposed to provide sufficient coverage of shielded structure 210. In some embodiments, super conducting material 220 may be a thin superconducting tape applied to shielded structure 210. A tape superconducting material 220 may be wrapped around structure 210, or applied in strips or patches to shielded structure 210 so as to cover shielded structure 210. In some embodiments, layers of a superconducting tape may overlap other layers of a super conducting tape. In particular embodiments, multiple layers of superconducting tape may be used to ensure adequate surface area of superconducting material 220, in a similar to multiple windings of a wire in an electromagnet.

In other embodiments, superconducting material 220 may be tiles that are layered onto shielded structure 210. Such superconducting tiles may be arranged in contact with one another in such a way that shielded structure 210 is not exposed to a plasma. Such tiles may be arranged side by side or be layered, in a manner similar to scales or shingles, in such a manner that shielded structure 210 is not exposed to a plasma. In other embodiments, superconducting material 220 may be applied to structure 210 as a coating, such as a paint or powder coating. In yet other embodiments, superconducting material 220 may be a pre-fabricated shell that is placed around shielded structure 210 before or after installation of shielded structure 210 into fusion plasma reactor chamber 110. In such embodiments, superconducting material 220 may be fabricated as a single shell surrounding shielded structure 210 or as a shell including multiple pieces that are assembled to surround shielded structure 210.

In some embodiments, any of the arrangements of superconducting material 220 described above may be disposed within the envelope of shielded structure 210. For example, superconducting material 220 may be disposed near the surface of shielded structure 210, such that superconducting material 220 is able to sufficiently exclude magnetic fields around shielded structure 210 without being exposed to direct contact with any plasma.

Superconducting material 220 may be any superconducting material. Depending on the material chosen, a cooling fluid with an appropriate temperature for superconducting material 220 should be selected. In some embodiments, superconducting material 220 may be a member of the class of superconductors known as "high temperature" superconductors. In general, high temperature superconductors are materials that become superconducting at a temperature above 30 Kelvin. Examples of classes of high temperature superconductors include, but are not limited to: cuprate superconductors, which include lanthanum barium copper oxide superconductors, thallium barium calcium copper oxide superconductors, strontium calcium copper oxide superconductors, and yttrium barium copper oxide superconductors; and iron pnictide superconductors.

In some embodiments, superconducting material 220 may be cooled to a temperature sufficient to cause superconducting material 220 to exclude a magnetic field, such as a magnetic field produced by internal magnetic coil structure 130 of FIG. 1. In some embodiments superconducting material 220 may be cooled to a temperature less than or equal 276 Kelvin. In some embodiments, superconducting material 220 may be cooled to a temperature less than or equal to 200 Kelvin. In particular embodiments, superconducting material 220 may be cooled to a temperature less than or equal 138 Kelvin. In particular embodiments, superconducting material 220 may be cooled to a temperature less than or equal 30 Kelvin. In other embodiments, superconducting material 220 may be cooled to a temperature less than or equal 20 Kelvin. In yet other embodiments, superconducting material 220 may be cooled to a temperature less than or equal 10 Kelvin. In some embodiments, superconducting material 220 may be cooled to a temperature less than or equal 4 Kelvin.

Superconducting material 220 may exclude external magnetic fields, such as a magnetic field produced by internal magnetic coil structure 130, because an external magnetic field causes a current to form within superconducting material 220 that produces a magnetic field that cancels out the external magnetic field. These internal currents may be created near the surface of superconducting material 220. Therefore, thin layers of superconducting material 220, such as the superconducting tape described above, may be sufficient to exclude magnetic fields. Superconducting material 220 may have a limit to the strength of the internal current that superconducting material 220 can support, and therefore a limit to the strength of the magnetic field that superconducting material 220 can exclude.

In some embodiments, the internal current that superconducting material 220 can support, and therefore the strength of an external magnetic field that superconducting material 220 can exclude, may depend on the temperature of superconducting material 220. Superconducting material 220 may be able to support a larger internal current and exclude a stronger magnetic field the farther it is cooled below its superconducting transition temperature. For example, superconducting material 220 may be able to support five times as much current when cooled to 30 K as it can when cooled to 77 K. Therefore, in some embodiments, it may be important to maintain cooling of superconducting material 220 to ensure a temperature is maintained that is sufficient for superconducting material 220 to be able to exclude a magnetic field produced inside of fusion plasma reactor chamber 110.

Cooling channels 230 may include pipes, tubes, passages or any other means of transporting a cooling fluid 240 in proximity to superconducting material 220. In some embodiments, cooling channels 230 may also provide cooling to internal magnetic coil structure 130. In some embodiments, cooling channels 230 may provide for cooling fluid 240 to be in direct contact with superconducting material 220. In other embodiments, cooling channels 230 may be constructed of a material with a high heat transfer coefficient, such as most metals. In these embodiments, superconducting material 220 may be in contact with the high heat transfer material of cooling channel 230, with the high heat transfer material transferring heat from superconducting material 220 to cooling fluid 240 within cooling channel 220. Examples of acceptable high heat transfer materials include, but are not limited to, copper, aluminum, iron, titanium, silver, gold, any other metal used in cryogenic applications, and alloys thereof. In some embodiments cooling channels 220 may include insulating breaks to improve thermal isolation of cooling channels 220.

Cooling fluid 240 may be any acceptable liquid, gas, or other fluid with a temperature low enough to cool superconducting material 220 to or below its superconducting transition temperature. Some examples of cooling fluids or gases include liquid oxygen, liquid, nitrogen, liquid helium, liquid argon, liquid neon, and gases of thereof, or any other fluid or gas with a temperature at or below the superconducting transition temperature of superconducting material 220.

In some embodiments, cooling channels 230 may be insulated on the side of cooling channels 230 that is closest to shielded structure 210 by insulating material 250, Insulation between cooling channels 230 and shielded structure 210 may prevent transfer of heat from shielded structure 210 into cooling channels 230, and therefore may increase cooling capacity of cooling channels 230 by preventing loss of cooling capacity through cooling channels 230 cooling shielded structure 210. Insulating material 250 may be disposed in any appropriate manner throughout shielded structure 210 to ensure adequate insulating of cooling channels 230 and superconducting material 220. Insulation between cooling channels 230 may be any form of insulation used in cryogenic applications. For example, insulation may include polymer foams, aerogels, fiberglass, mineral wool or other insulating materials. In some embodiments, insulation between cooling channels 230 and shielded structure 210 may be a double walled vacuum structure, similar to those found in Dewar flasks or bottles commonly used for storing cryogenic liquids. Such a structure may have two walls separated by a space which contains a vacuum, which provides insulation between the environments separate by the two walls. In some embodiments, insulating material 250 may also be disposed between superconducting material 220 and the surface of shielded structure 210. In such an embodiment, insulating material 250 may prevent or slow heat from shielded structure 210 from being conducted into superconducting material 250 and thereby preserve the strength of magnetic fields that superconducting material 220 is able to exclude.

In other embodiments, cooling channels 230 may not carry a fluid but may be thermoelectric cooling units. In some embodiments, a thermoelectric cooler may be disposed between superconducting material 220 and cooling channels 230.

Figure 3:
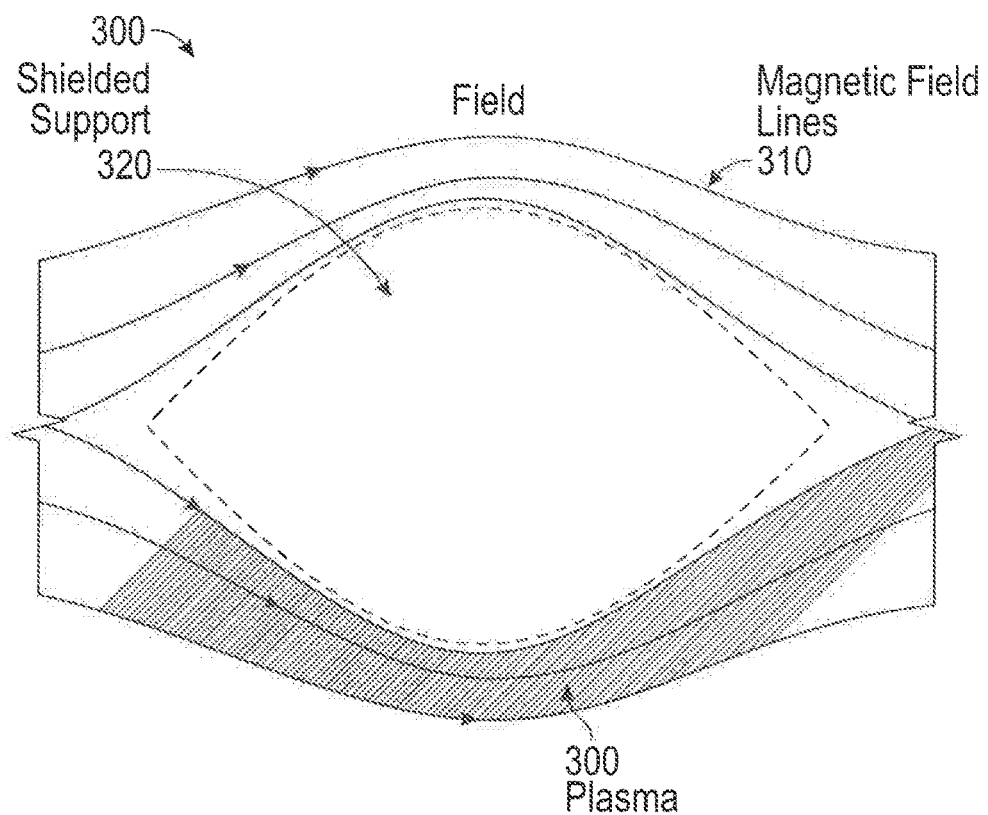
FIG. 3 illustrates a structure shielded with a superconducting material immersed in a plasma, according to certain embodiments.

FIG. 3 illustrates a cross section 300 of shielded structure 320 shielded with a superconducting material immersed in a plasma, according to certain embodiments. Shielded structure 320 may be a support structure, such as support structure 120 of FIG. 1, that is shielded by a superconducting material, such as superconducting material 220 of FIG. 2. In other embodiments, shielded structure may be any other structure or object immersed in a plasma, such as a spacecraft 610 of FIG. 6, or probe 710 of FIG. 7. When exposed to a magnetic field, such as a magnetic field generated by internal magnetic coil structure 130, the superconducting material shielding shielded structure 320 may exclude the magnetic field. In FIG. 3, magnetic field lines 310 are pushed or bent around shielded structure 320 because the superconducting material excludes the magnetic field. Because a plasma is electrically charged, it may follow magnetic field lines 310. Therefore by excluding magnetic field lines 310, superconducting material 220 may prevent plasma 330 from contacting structure 320. Plasma 330 may be any plasma. In a particular embodiment, plasma 330 may be a fusion plasma contained within fusion plasma reactor chamber 110 of FIG. 1. This method of shielding structure 320 from a plasma using a superconducting material may be referred to as "passive" shielding, because no external power needs to be supplied to the superconducting material for it to exclude the magnetic field, as long as the super conducting material is adequately cooled.

In some embodiments superconducting material 220 may sufficiently exclude magnetic field lines 310 to prevent any plasma from contacting shielded structure 320. In other embodiments superconducting material 220 may sufficiently exclude magnetic field lines 310 to prevent the majority of a plasma from contacting shielded structure 320. In some embodiments, superconducting material 220 may sufficiently exclude magnetic field lines 310 to prevent more than 99.9% of plasma 330 from contacting structure 320. In some embodiments, superconducting material 220 may sufficiently exclude magnetic field lines 310 to prevent more than 99% of plasma 330 from contacting shielded structure 320. In some embodiments, superconducting material 220 may sufficiently exclude magnetic field lines 310 to prevent more than 90% of plasma 330 from contacting shielded structure 320.

Preventing contact between a plasma and shielded structure 320 using a superconducting material may have at least two advantages. First, damage to shielded structure 320 by the hot plasma may be prevented. This could prevent failure of a fusion reactor and increase time intervals between maintenance on the reactor. Second, preventing contact between a plasma and shielded structure 320 may prevent heat loss from the plasma to shielded structure 320, which may increase the efficiency of a fusion reaction. An additional benefit of using a superconducting material to passively shield structure 320, is that the ability of the superconducting material to exclude an external magnetic fields may automatically and rapidly adjust in response to variances in the external magnetic field. This may eliminate the need for complex control systems, as described below with reference to FIG. 4.

Figure 4:
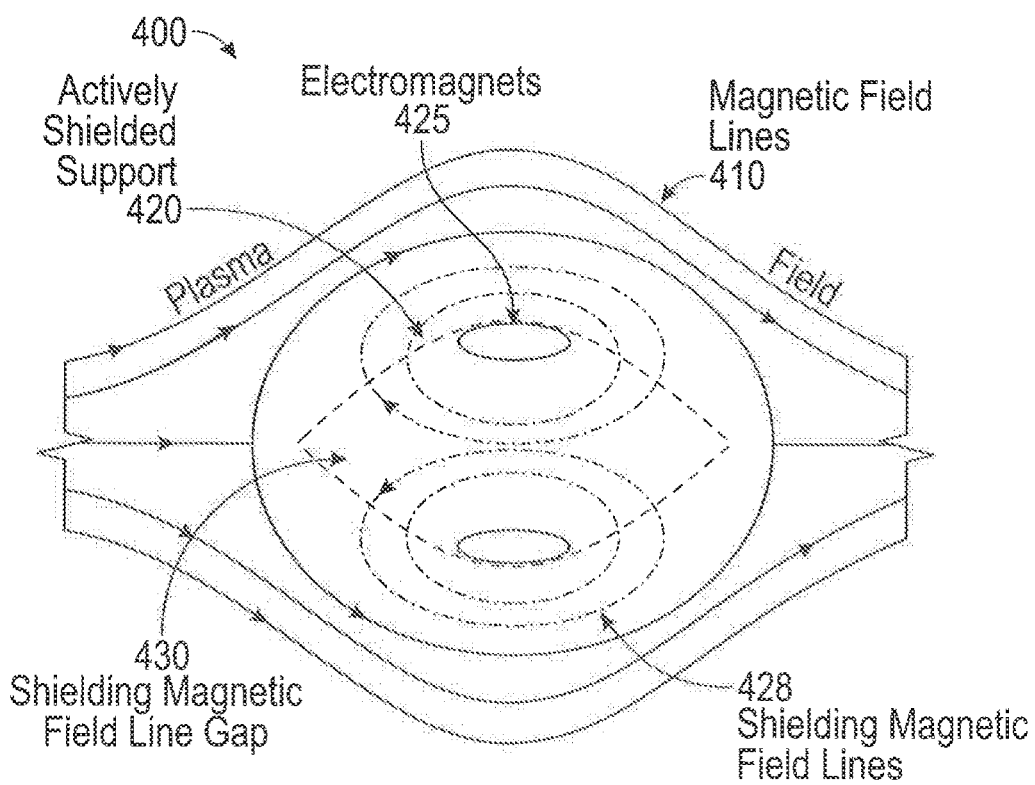
FIG. 4 illustrates a structure with actively driven electromagnetic shielding immersed in a plasma, according to certain embodiments.

Another advantage of a structure passively shielded by a superconducting material is illustrated by FIG. 4, which illustrates a cross section 400 of a structure with actively driven electromagnetic shielding, according to certain embodiments. FIG. 4 includes an actively shielded structure 420, electromagnets 425, external magnetic field 410, shielding magnetic field 428, and shielding magnetic field gap 430. Unlike FIGS. 1 through 3, which illustrate a structure passively shielded by a superconducting material that excludes magnetic fields, FIG. 4 illustrates an actively shielded structure 420 that is shielded from a plasma by shielding magnetic fields 428 produced by electromagnets 425.

Shielding magnetic fields 428, produced by electromagnets 425, may divert external magnetic field 410, such as a magnetic field produced by internal magnetic coil structure 130 of FIG. 1, around actively shielded structure 420. A plasma may follow external magnetic field lines 410 and thus be diverted from contacting actively shielded structure 420 by shielding magnetic fields 428.

However, unlike superconducting material 220 of FIG. 2, electromagnets 425 require an external power source to produce shielding magnetic fields 428. Electromagnets 425 also may require cooling to prevent them from overheating, and may require cryogenic cooling if superconducting electromagnets are used as electromagnets 425. Additionally, because shielding magnetic fields 428 are not created in response to external magnetic field 410, but rather by power supplied to electromagnets 425, a system to control electromagnets 425 may be needed to ensure that shielding magnetic fields 428 are controlled to adequately compensate for variances in external magnetic field 410. Such a control system may have a lag time between when a change to external magnetic field 410 occurs and when adjustments are made to shielding magnetic fields 428. Therefore, disadvantages of a actively shielded structure 420 when compared to a passively shield structure 320, is that the actively shielded structure 420 may be more complex than because it requires external power and a control system, and that an actively shielded structure 420 may not be able to compensate for changes in an external magnetic field as quickly as a passively shielded structure 320.

An additional disadvantage of an actively shielded structure 420 is that magnetic field gaps 430 may be created between the shielding magnetic fields 423 produced by electromagnets 425. Magnetic field gaps 430 may create areas where external magnetic field 410 is not prevented from penetrating actively shielded structure 420. Accordingly, magnetic field gaps 430 may allow plasma following external magnetic field lines 410 to contact actively shielded structure 420. As explained elsewhere herein, contact between actively shielded structure 420 and a plasma may result in damage to actively shielded structure 420 by the plasma and of undesirable heat loss from the plasma to actively shielded structure 420.

Figure 5:
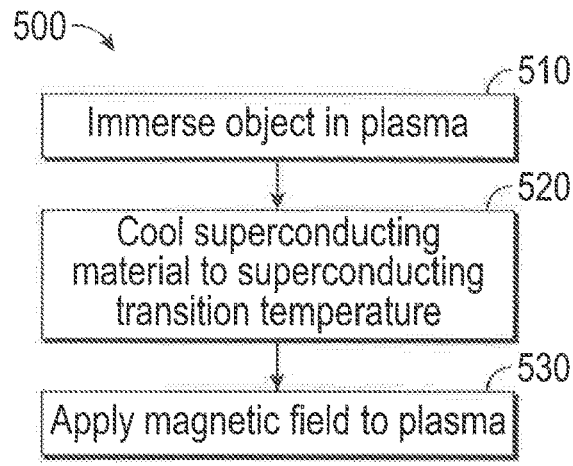
FIG. 5 illustrates a method for shielding an object from a plasma using a superconducting material, according to certain embodiments.

FIG. 5 illustrates a method 500 for shielding an object from a plasma using a superconducting material, according to certain embodiments. FIG. 5 includes steps of cooling a superconducting material to a superconducting transition temperature at step 510, applying a magnetic field near or around an object including the superconducting material at step 520, and immersing the object in a plasma at step 530, which will be explained in detail below.

At step 510, a superconducting material that at least partially surrounds, or is disposed near the surface of the object, such as superconducting material 220 of FIG. 2, may be cooled to a temperature at or below a superconducting transition temperature for the superconducting material. At or below the superconducting transition temperature, the superconducting material may demonstrate superconducting properties including having zero internal resistance to electrical current flow and excluding magnetic fields in which the superconducting material is placed.

Cooling the superconducting material may be accomplished by a variety of means, such as those described with respect to cooling channels 230 of FIG. 2, as described with respect to FIG. 2, the strength of a magnetic field that a superconducting material may be able exclude may depend on the temperature of the superconducting material. In some embodiments, the superconducting material may be cooled to a temperature sufficient to cause the superconducting material to exclude the magnetic field. In some embodiments the superconducting material may be cooled to a temperature less than or equal 276 Kelvin. In some embodiments, the superconducting material may be cooled to a temperature less than or equal to 200 Kelvin. In particular embodiments, the superconducting material may be cooled to a temperature less than or equal 138 Kelvin. In particular embodiments, the superconducting material may be cooled to a temperature less than or equal 30 Kelvin. In other embodiments, superconducting material 220 may be cooled to a temperature less than or equal 20 Kelvin. In yet other embodiments, superconducting material 220 may be cooled to a temperature less than or equal 10 Kelvin. In some embodiments, superconducting material 220 may be cooled to a temperature less than or equal 4 Kelvin.

At step 520, a magnetic field may be created in or applied to a space which contains the plasma formed at step 530. In some embodiments the magnetic field may be produced, such as a magnetic field produced by internal magnetic coil structure 130 of FIG. 1. In other embodiments, the magnetic field may be present in the environment, such as a magnetic field permeating outer space. Because a superconducting material may exclude magnetic fields when cooled below the superconducting transition temperature of the material, the magnetic field may be excluded from the object after the superconducting material shielding the object has been cooled at step 510. As explained with respect to FIGS. 2 and 3, since the plasma may follow the magnetic field, superconducting material may be protected from contact with the plasma by excluding the magnetic field.

At step 530 an object with superconducting material shielding, such as shielded structure 210 of FIG. 2, may be immersed in a plasma. In some embodiments, at step 510, a plasma may be created, around a fixed object. For example, a fusion plasma may be created inside of a fusion reactor, such as fusion plasma reactor chamber 110 of FIG. 1, in which an object, such as support structure 120 of FIG. 1 is held fixed. Other examples of plasmas that may be created include plasmas for plasma vapor deposition, plasma etching, plasma polymerization, or plasma exhaust streams from a plasma propulsion engine or ion propulsion engine. Other examples of a plasma in which an object may be immersed include plasmas in outer space, such as the solar wind.

Although illustrated sequentially in FIG. 5, steps 510, 520, and 530 may occur in any order. For example, a plasma may be produced inside of fusion plasma reactor chamber 110 at step 530, then a superconducting material shielding an object, such as support structure 120 of FIG. 1, may be cooled to temperature at or below its superconducting temperature at step 510, and finally the plasma and object may be exposed to a magnetic field generated by internal magnetic coil structure 130 at step 530. Alternatively, a magnetic field may be applied to a plasma prior to a superconducting material being cooled to a temperature at or below the superconducting transition temperature of the superconducting material.

Shielding provided by a superconductor may also be beneficial in applications besides fusion reactors in which objects may be immersed in a flow of plasma. Charged particles that behave essentially as a low density plasma may be present throughout space outside of the Earth's magnetic field. For example, the solar wind may be considered to be a low density plasma. Superconducting materials may product spacecraft from plasmas found in space. Additionally, numerous varieties of probes may be placed in plasmas for monitoring purposes. Superconducting materials may product such probes from damage when immersed in plasma, allowing the probe to operate for longer periods of time than an unshielded probe.

Figure 6:
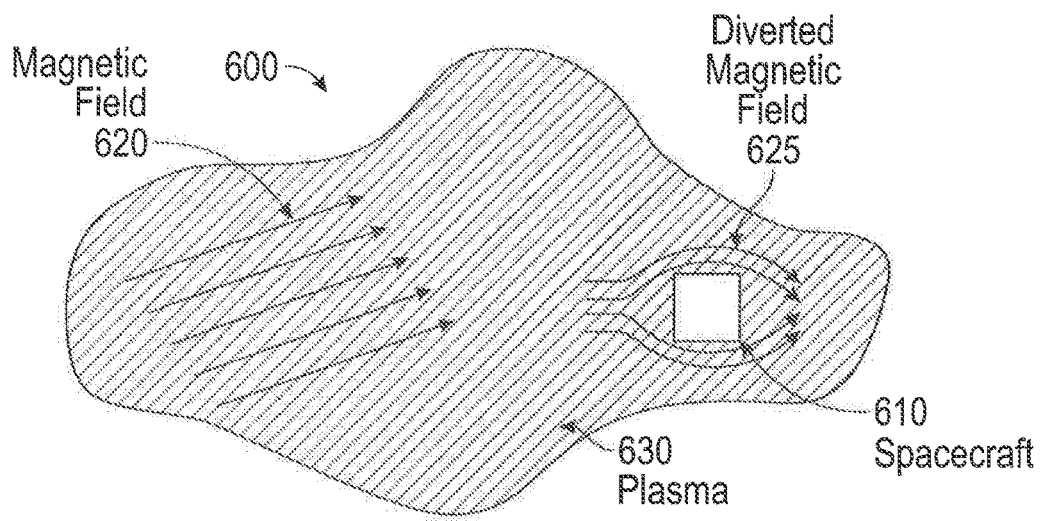
FIG. 6 illustrates a spacecraft with superconducting material shielding immersed in a plasma, according to certain embodiments.

FIG. 6 illustrates a spacecraft 610 with superconducting material shielding immersed in a plasma 630, according to certain embodiments. Superconducting material surrounding all or a portion of spacecraft 610 may exclude magnetic fields, such as magnetic field 620, present in space and effectively shield spacecraft 610 from any plasma 630 or charged particles present in space. Such plasmas and charge particles could include solar radiation, cosmic rays, and any other form of charge particle found in space, and may follow the path of diverted magnetic field 625. Spacecraft 610 could operate in any environment of space including interplanetary space, interstellar space or intergalactic space.

In some embodiments, superconducting material may surround the entirety of spacecraft 610. In other embodiments superconducting material may surround a portion of spacecraft 610, such as a crew compartment in which a human crew lives or works, a compartment containing sensitive instruments, or a storage compartment. In other embodiments, superconducting material may be disposed within the envelope of spacecraft 610. For example, superconducting material may be disposed near the surface of spacecraft 610, such that it is able to exclude all or most of a magnetic field from contacting spacecraft 610, but is protected from incidental contact with plasma 630 by an outer skin of spacecraft 610.

Figure 7:
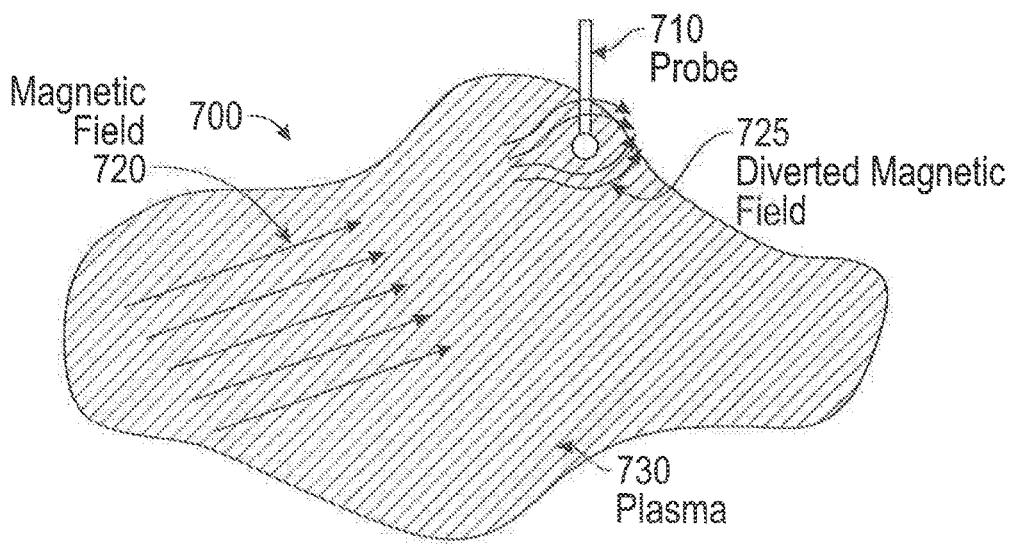
FIG. 7 illustrates a probe with superconducting material shielding immersed in a plasma, according to certain embodiments.

FIG. 7 illustrates a probe 710 with superconducting material shielding immersed in a plasma 730, according to certain embodiments. Probe 710 may be any type of probe or sensor, including pressure sensors, temperature sensors, photo sensors, antenna, or any other device for receiving or measuring information. Probe 710 may be used to measure one or more properties of plasma 730 in which it is immersed, such as the temperature of plasma 730. However plasma 730 may damage probe 710 if probe 710 is not protected from contact with plasma 730. Surrounding probe 710 with a superconducting material, in a manner similar to superconducting material 220 described with respect to FIG. 2, may exclude magnetic fields, such as magnetic field 720, around probe 710 and thereby protect probe 7 10 from plasma 730 by diverting plasma 730 along the excluded magnetic field 725 in a manner similar to that described with respect to FIG. 3.

Examples of environments in which a probe 710 with superconducting material shielding could be used include a fusion plasma contained in fusion plasma reactor chamber 110 of FIG. 1, a plasma for use in plasma vapor deposition, a plasma for use in plasma etching, a plasma for use in plasma polymerization, a plasma exhaust from a plasma propulsion engine or ion propulsion engine for a spacecraft, or any other magnetized plasma environment.

Modifications, additions, or omissions may be made to the methods described herein without departing from the scope of the invention. For example, the steps may be combined, modified, or deleted where appropriate, and additional steps may be added. Additionally, the steps may be performed in any suitable order without departing from the scope of the present disclosure.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A fusion reactor comprising:
   a fusion plasma reactor chamber;
   a magnetic coil structure disposed inside of the fusion plasma reactor chamber;
   a structural component disposed inside of the fusion plasma reactor chamber, wherein the structural component couples the magnetic coil structure to the fusion plasma reactor chamber;
   a superconducting material disposed at least partially within the structural component;
   a plurality of cooling channels disposed at least partially within the structural component; and
   an insulating material disposed at least partially within the structural component.

2. The fusion reactor of claim 1, wherein the plurality of cooling channels comprises a plurality of metal tubes.

3. The fusion reactor of claim 1, wherein the superconducting material comprises a superconducting tape.

4. The fusion reactor of claim 1, wherein the superconducting material comprises a plurality of superconducting tiles.

5. The fusion reactor of claim 1, wherein the superconducting material is cooled to a temperature equal to or below a superconducting transition temperature of the superconducting material.

6. The fusion reactor of claim 1, wherein the superconducting material excludes a magnetic field from penetrating the structural component.

7. The fusion reactor of claim 1, wherein the insulator comprises two walls separated by a near vacuum.

8. The fusion reactor of claim 1, wherein a cooling fluid is circulated through the plurality of cooling channels.

9. The fusion reactor of claim 1, further comprising a fusion plasma contained inside of the fusion plasma reactor chamber.

* * * * *